(12) United States Patent
Kwak et al.

(10) Patent No.: US 7,421,775 B2
(45) Date of Patent: Sep. 9, 2008

(54) METHOD OF MANUFACTURING ANTENNA FOR RFID TAG

(75) Inventors: Jae-hyun Kwak, Seoul (KR); Se-jin Lim, Seoul (KR); Soo-ho Kim, Suwon-si (KR)

(73) Assignee: Samsung Techwin Co., Ltd., Changwon (KR)

( * ) Notice: Subject to any disclaimer, the term of this patent is extended or adjusted under 35 U.S.C. 154(b) by 486 days.

(21) Appl. No.: 11/173,618

(22) Filed: Jul. 1, 2005

(65) Prior Publication Data

US 2006/0143898 A1    Jul. 6, 2006

(30) Foreign Application Priority Data

Dec. 28, 2004    (KR) .............. 10-2004-0113696

(51) Int. Cl.
*H01P 11/00* (2006.01)
*H01L 35/00* (2006.01)

(52) U.S. Cl. ............ 29/600; 29/601; 29/592.1; 29/831; 343/700 MS

(58) Field of Classification Search ......... 29/600–601, 29/830–831, 592.1, 593; 343/700 MS, 809, 343/795, 767; 340/572.1–572.8, 10.34; 156/272.2
See application file for complete search history.

(56) References Cited

U.S. PATENT DOCUMENTS

| | | | | |
|---|---|---|---|---|
| 6,265,977 B1 * | 7/2001 | Vega et al. | ............... | 340/572.7 |
| 6,271,793 B1 * | 8/2001 | Brady et al. | .......... | 343/700 MS |
| 7,116,227 B2 * | 10/2006 | Eckstein et al. | ............ | 340/571 |
| 7,120,987 B2 * | 10/2006 | Liu et al. | ..................... | 29/600 |
| 7,250,868 B2 * | 7/2007 | Kurz et al. | .............. | 340/572.7 |
| 2006/0143898 A1 * | 7/2006 | Kwak et al. | .................. | 29/600 |

* cited by examiner

*Primary Examiner*—Minh Trinh
(74) *Attorney, Agent, or Firm*—Drinker Biddle & Reath LLP

(57) ABSTRACT

A method of easily and inexpensively manufacturing an antenna for an RFID tag by forming the antenna using magnets of a pattern corresponding to a shape of the antenna is provided. One example method includes a) placing a substrate above a level of a fluid containing a conductive substance, b) placing a magnet (e.g., an electromagnet including an electrode) formed in a shape of an antenna pattern above a surface of the substrate, and adhering the conductive substance to a bottom of the substrate in the shape of the antenna pattern by a magnetic force, and c) fixing the conductive substance adhered to the bottom of the substrate.

7 Claims, 4 Drawing Sheets

METHOD OF MANUFACTURING ANTENNA FOR RFID TAG

CROSS-REFERENCE TO RELATED PATENT APPLICATIONS

This application claims the priority of Korean Patent Application No. 10-2004-0113696, filed on Dec. 28, 2004, in the Korean Intellectual Property Office, the disclosure of which is incorporated herein in its entirety by reference.

BACKGROUND OF THE INVENTION

1. Field of the Invention The present invention relates to a method of manufacturing an antenna for a radio frequency identification (RFID) tag.

2. Description of the Related Art

An RFID tag typically includes a single antenna or an antenna formed by a single closed loop, and at least one integrated circuit chip electrically connected to the antenna. Information is stored in the integrated circuit chip through the antenna, and information that is stored in the integrated circuit chip is updated or transmitted by an RFID reader/programmer through the antenna.

Such an RFID tag may be applied to various fields of logistics management system, electronic cash, credit card, or the like. The RFID tag is inputted with previously set data through a contact input system or contactless input system. More particularly, an input of a terminal comes into contact with a contact substrate formed on an electronic radio frequency identification device to implement operation of interest, or the RFID tag is recorded with initial information by a writer for RFID tag. In the practical use after the initial information is recorded in the RFID tag, the data is wirelessly communicated between the RFID tag and the terminal.

Examples of a conventional electronic radio frequency identification apparatus are shown in FIGS. 1 through 4, in which FIGS. 1 and 3 are plan views of a conventional RFID tag, FIG. 2 is a cross-sectional view taken along a line II-II in FIG. 1, and FIG. 4 is a cross-sectional view taken along a line IV-IV in FIG. 3.

Referring to FIGS. 1 through 4, RFID tags 10 and 20 include an RFID integrated circuit chip 12 and an antenna 11.

The RFID integrated circuit chip 12 is electrically connected to the antenna 11, so that the chip is actuated by energy produced due to an electromagnetic field induced according to Faraday's law to store, retrieve and update information. The RFID integrated circuit chip 12 is electrically connected to a terminal of the antenna 11 through an anisotropic conductive film (ACF) 13.

The antenna 11 is formed in the shape of a coil along a border of the RFID tag 10, 20 to form a closed loop. The antenna 11 is configured to have a certain resonance frequency, so that the antenna 11 receives new information through radio communication with a reader (not shown) to store the information in the integrated circuit chip 12 or transmit the information from the chip 12 to the reader.

As shown in FIGS. 1 and 2, both ends 11a and 11b of the antenna 11 may be connected to each other through a crimping connection 14 and a metal (e.g., aluminum) foil 15 so as to form the antenna 11 in the shape of a closed loop.

As shown in FIGS. 3 and 4, both ends 11a, 11b of the antenna 11 may be connected to a terminal 25 that is, for example, made of silver, through a portion insulated by a solder resist 27.

The antenna 11 for the RFID tag 10, 20 configured as described above is generally manufactured through etching. More particularly, an insulating film is applied with a photoresist, and is subjected to an exposure process by use of a photomask. Unwanted portions are exposed and removed from the insulating film through etching (e.g., chemical etching) to form the antenna 11 from a metallic layer that is deposited or otherwise disposed on the insulating film.

Alternatively, ink is printed on an insulating film in a desired pattern corresponding to an antenna shape by use of a screen mask. The pattern formed with the ink is cured, and the other portion is removed by etching, thereby forming the antenna.

The above methods have a drawback in that an amount of the material to be removed is more than a material to be used for the antenna. Also, the foregoing methods involve time consuming and complicated processes. Moreover, since the photomask and screen mask are expensively formed, manufacturing costs of masked and etched antennas for RFID tags are increased. As such, a new method of manufacturing an antenna for an RFID tag is highly demanded to solve the above drawbacks.

SUMMARY OF THE INVENTION

The present invention provides an improved method of manufacturing an antenna for RFID tag. In particular, an aspect of the present invention provides a method of manufacturing an antenna for RFID tag which reduces a manufacturing time, excludes equipments to be utilized in a conventional manufacturing process, and reduces an amount of material to be used.

According to one aspect of the present invention, there is provided a method of manufacturing an antenna for an RFID tag, comprising: a) placing a substrate above a level of a fluid containing a conductive substance; b) placing an electrode formed in a shape of an antenna pattern above a surface of the substrate, and applying a current to the electrode, to adhere the conductive substance to a bottom of the substrate in the shape of the antenna pattern by an electromagnetic force; and c) fixing the conductive substance adhered to the bottom of the substrate.

The process c) may be implemented under an electric field and a magnetic field generated by the electrode.

According to another aspect of the present invention, there is provided a method of manufacturing an antenna for an RFID tag, comprising: a) placing a thin film above magnets shaped in a desired pattern; b) spraying a certain amount of conductive particles having a desired magnetic property on a surface of the thin film to form the conductive particles in the same pattern as the pattern of the magnet; c) contacting a substrate, on which an adhesive is applied, with the pattern of the conductive particles formed on the thin film, to adhering the conductive particles pattern to the substrate, with the pattern of the conductive particles being maintained; and d) fixing the conductive particles adhered to the adhesive.

The method may further comprise spraying a particle fixing liquid on the conductive particles fixed in the process d), or attaching a pattern protecting sheet to the conductive particles fixed in the process d).

According to another aspect of the present invention, there is provided a method of manufacturing an antenna for an RFID tag, comprising: a) placing a substrate above magnets shaped in a desired pattern; b) spraying a certain amount of conductive particles on a surface of the substrate to form the conductive particles in the same pattern as the pattern of the magnet; and c) fixing the conductive particles to the substrate.

The method may further comprises spraying a particle fixing liquid on the conductive particles patterned in the process c), or attaching a pattern protecting sheet to the conductive particles patterned in the process c).

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
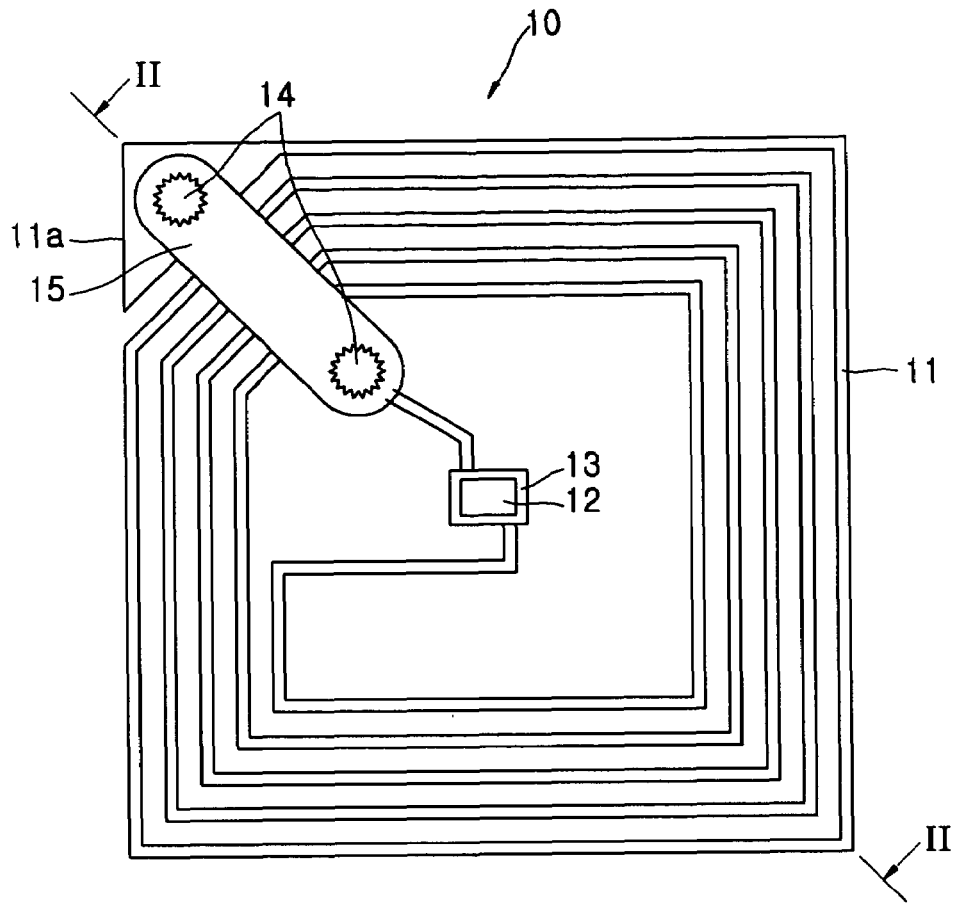
FIG. 1 is a plan view of one example of a conventional RFID tag.
Figure 2:
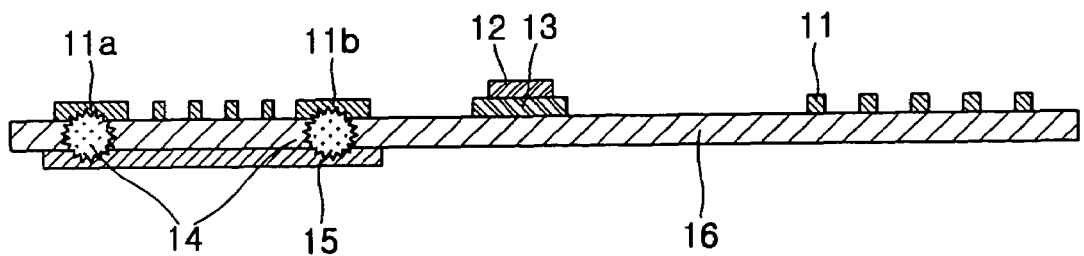
FIG. 2 is a cross-sectional view taken along a line II-II in FIG. 1.
Figure 3:
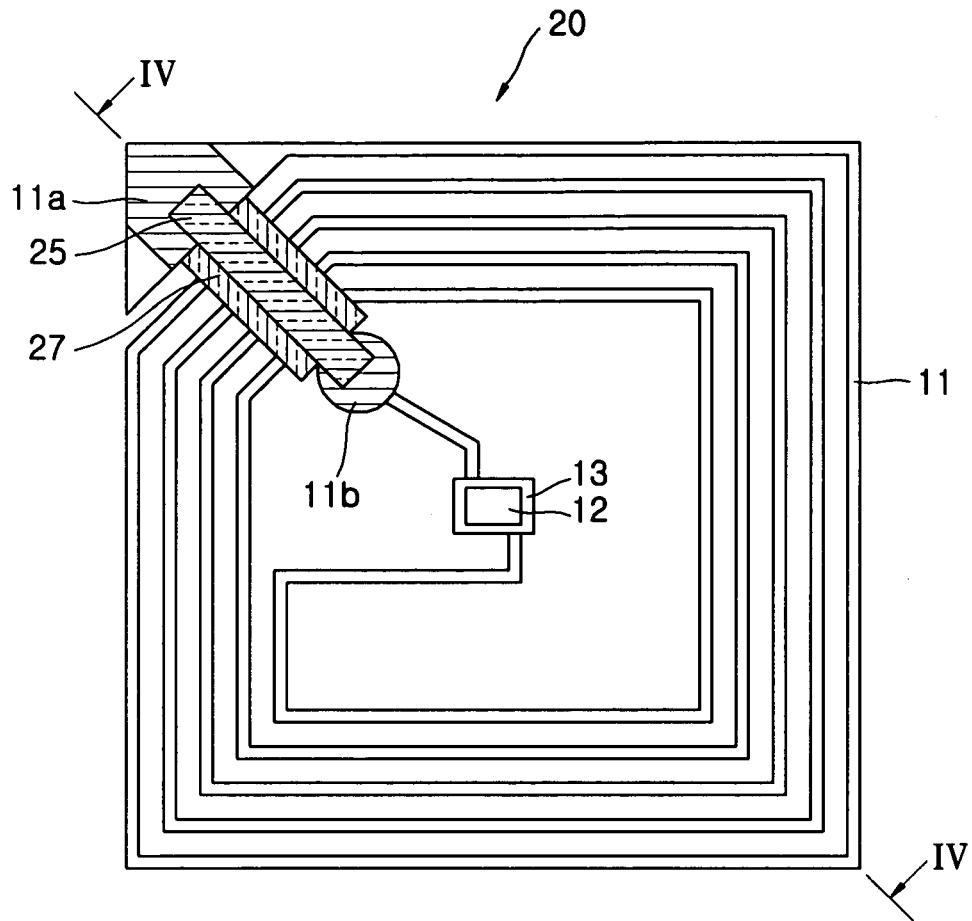
FIG. 3 is a plan view of another example of a conventional RFID tag.
Figure 4:
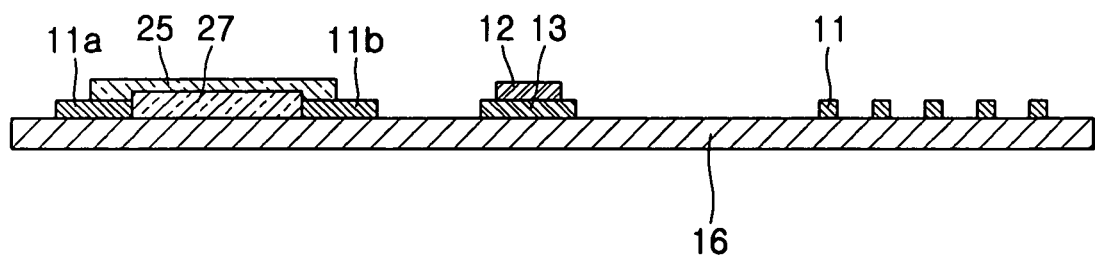
FIG. 4 is a cross-sectional view taken along a line IV-IV in FIG. 3.

Reference will now be made in detail to a process of manufacturing an antenna for an RFID tag according to an embodiment of the present invention with reference to the accompanying drawings, in which the same elements as those described in the Description of the Related Art are indicated by same reference numerals.

Figure 5:
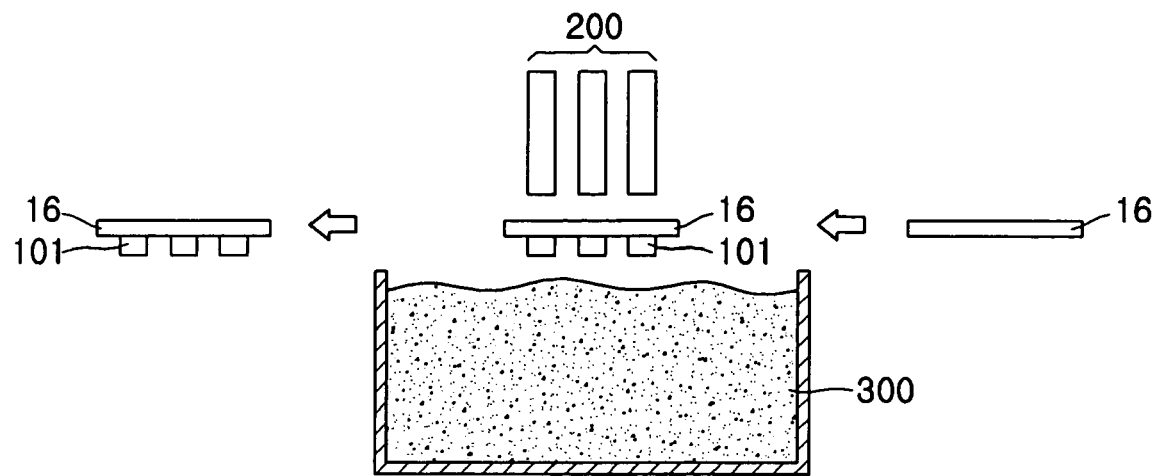
FIG. 5 is a view schematically depicting a process of manufacturing an antenna for an RFID tag according to an embodiment of the present invention.

FIG. 5 is a view schematically depicting a process of manufacturing an antenna for an RFID tag according to an embodiment of the present invention.

Referring to FIG. 5, according to the process of manufacturing the antenna for the RFID tag according to the present invention, electrodes 200 are placed above a container with a fluid 300 containing a conductive substance, and a desired pattern of the conductive substance is formed at a bottom surface of a substrate 16 by an electric field that is generated from the electrodes 200.

More specifically, the substrate 16 is placed above a level of the fluid 300 containing the conductive substance. Then, the electrodes 200, each of which is configured to have the pattern of the antenna, are placed above the top surface of the substrate 16. When a strong current is applied to the electrodes 200, an electric field is generated from the electrodes 200 and conductive particles are moved by the electric field and an associated magnetic field so that the conductive particles are adhered to the bottom surface of the substrate 16 in the shape of antenna pattern 101. The conductive particles that are adhered to the substrate 16 are then fixed or cured to form the antenna pattern 101. A process of evaporating the fluid 300 containing the conductive particles may be employed to provide airborne or otherwise freely-moving conductive particles that become fixed to the substrate 16. Other like processes known in the art, such as, those used in chemical vapor deposition (CVD) may be employed to provide the conductive particles.

Then, after the antenna pattern 101 is fixed or cured, the substrate 16 is cut to separate the individual antenna patterns and an integrated circuit chip for RFID is connected to each of the cut substrates 16. After both terminals of the antenna pattern 101 are electrically connected to each other, a protective sheet covers the antenna pattern 101 to complete the RFID tag (not shown).

Since the conductive substance is used as a main component of the antenna, the conductive substance has to contain conductivity and magnetism. In other words, the conductive substance may be a fluid containing metal ions having a positive charge or fine magnetic particles such as Fe, Co, Ni, Al, Ag, Au or the like.

In some embodiments, the substrate 16 is a thin substrate, such as flexible printed circuit board, but any suitable substrate may by utilized if the electromagnetic force may be exerted on a rear side of the substrate by the electric field produced around the electrodes 200. As can be appreciated, the substrate 16 is made of a non-magnetic material. For example, the substrate may be made of paper or of a polyethylene terephthalate (PET) film. The PET film is utilized for magnetic tapes for audio or video, or packaging films, and has good transparence, thermal stability, and tensile strength, compared to films made of other material and having the same thickness, which can be made to have a thin and uniform thickness, as well as excellent post-process such as laminating, printing and coating.

In order to prevent the conductive substance from being detached from the substrate 16, a process of fixing the antenna pattern 101 made of the conductive substance to the substrate 16 is implemented with generation of the electromagnetic force by the electrodes 200. In addition, if the substrate 16 is made of a material capable of absorbing fluid, such as, for example, a conductive ink, the electrodes 200 may not be moved to implement the fixing process.

FIGS. 6A through 6E are views sequentially depicting a process of manufacturing an antenna for an RFID tag according to another embodiment of the present invention.

Figure 6A:
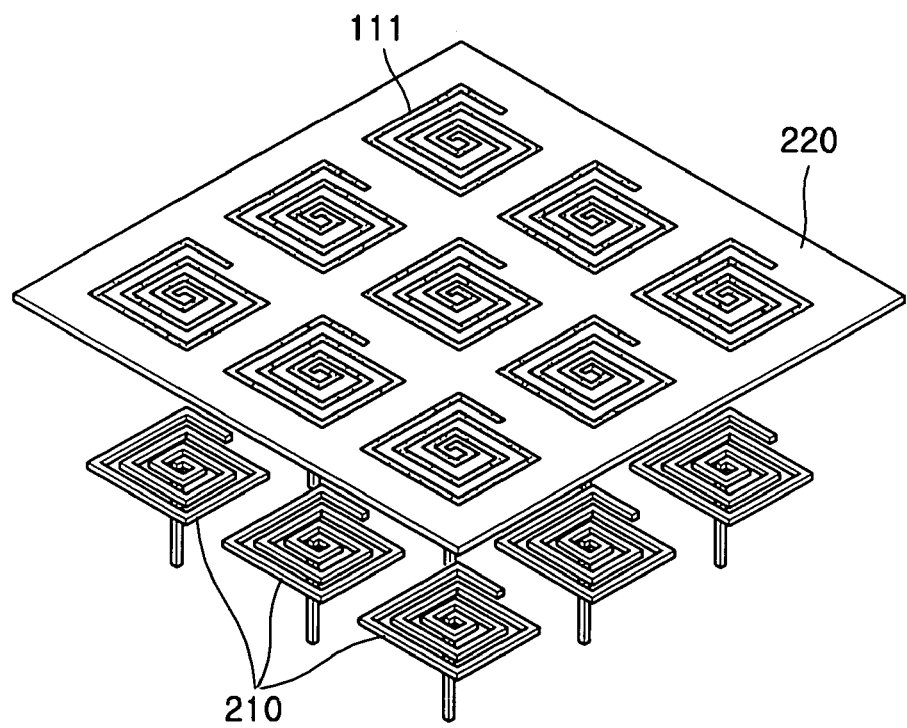
FIGS. 6A through 6E are views sequentially depicting a process of manufacturing an antenna for an RFID tag according to another embodiment of the present invention.
Figure 6B:
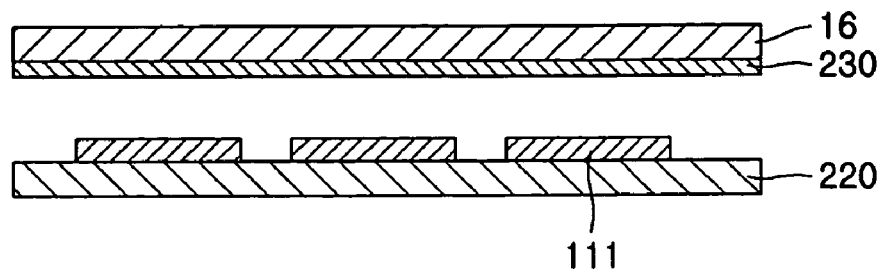
Figure 6C:
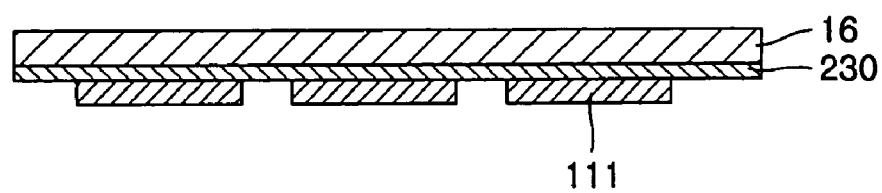
Figure 6D:
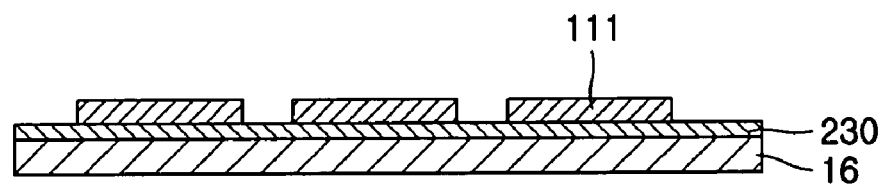
Figure 6E:
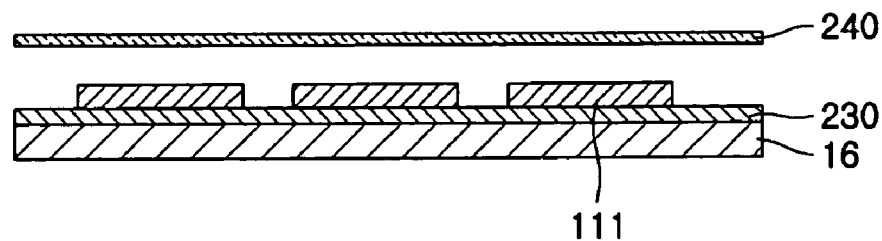

As shown in FIG. 6A, first, a thin film 220 is disposed above magnets 210, each of which is configured to produce a desired antenna pattern 111 (e.g., spiral-type patterns as shown). Next, conductive particles are sprayed on an upper surface of the thin film 220. The conductive particles are formed into the antenna patterns 111 by a magnetic force that is produced by the magnet 210. Now, as shown in FIG. 6B, a substrate 16 that includes an adhesive 230 disposed thereon is oriented above the surface of the thin film 220 on which the antenna patterns 111 has been formed. The substrate 16 is lowered so that adhesive 230 contacts the antenna patterns 111. Thereafter, the substrate 16 is raised so the adhesive 230 lifts the antenna patterns 111 from the thin film 220 and retains the antenna patterns 111 on the substrate 16 as shown in FIG. 6C. After the antenna patterns 111 are adhered to the adhesive 230, the substrate 16 may be turned over or otherwise oriented so that the antenna patterns 111 are disposed on an upper surface as shown in FIG. 6D. Curing of the adhesive 230 and the conductive particles forming the antenna patterns 111 is performed to fix the antennas 11 on the substrate 16. Then, a particle fixing liquid may be further sprayed or otherwise applied on the surface of the substrate 16, and a post-process may be further implemented to connect an RFID integrated circuit chip with each of the antenna patterns 111 and form the closed loop for each antenna, thereby completing the RFID tag. As shown in FIG. 6E, a pattern protecting sheet 240 for protecting the antenna pattern 111 and the RFID integrated circuit chip may be attached to the antenna pattern 111.

In another embodiment, the foregoing process of manufacturing the antenna may be simplified by selecting the substrate 16 to be the thin film 220 on which the antenna pattern 11 has to be finally formed. In this way, the steps of removing the antenna patterns 111 from the thin film 220 by an adhesive 230 may be omitted.

In this embodiment, a substrate 16 is placed above magnets 210, each of which is formed in the shape of a desired antenna pattern 111, and a certain amount of conductive particles are sprayed on the substrate 16. Thus, the sprayed-on particles form the antenna pattern 111 on the substrate 16 corresponding to the shape of the magnet 210 and a corresponding electromagnetic field therefrom. Finally, the antennas 11 are completed by curing the conductive particles formed in antenna patterns 111 on the substrate 16 and then spraying on the particle fixing liquid or attaching a pattern protecting sheet 240 as mentioned above.

In some embodiments, the magnet 210 is an electromagnet comprising a ferromagnetic core and a coil wound around the ferromagnetic core. In other embodiments, a ferric magnet may be employed. In the case of employing the electromagnet, it is possible to easily generate and remove a magnetic force, which can conveniently design the process.

The process of manufacturing the antenna for RFID tag described hereinbefore may be applied to formation of electronic circuit pattern, as well as an antenna for wireless communication to be formed on a substrate.

With the above description, since the present invention does not require a separate process for forming a mask or pattern compared to a conventional etching process, the number of forming steps is reduced, thereby manufacturing the antenna and the circuit pattern at high speed and thus cutting down manufacturing costs thereof.

Also, in a conventional etching method for manufacturing the antenna pattern, 70% to 80% of material is usually lost by etching. However, the present invention can remarkably reduce a loss of the material.

While the present invention has been particularly shown and described with reference to exemplary embodiments depicted in the drawings, it will be understood by those of ordinary skill in the art that various changes and modifications in form and details may be made therein without departing from the spirit and scope of the present invention. Therefore, the true spirit and scope for protection of the present invention is defined by the following claims.

What is claimed is:

1. A method of manufacturing an antenna for an RFID tag, the method comprising:
    orienting at least one magnet configured to produce a magnetic field that has a desired antenna shape above and substantially proximate to a container holding a fluid containing a conductive substance to attract the conductive substance from the container;
    disposing a nonconductive substrate between the at least one magnet and the container;
    forming a conductive pattern corresponding to the antenna shape of the magnetic field on a bottom surface of the nonconductive substrate; and
    fixing the formed conductive pattern to the bottom surface of the nonconductive substrate to form the antenna.

2. The method of claim 1 wherein the orienting step comprises arranging a plurality of magnets in an array so that a plurality of conductive patterns are formed simultaneously on the bottom surface of the nonconductive substrate.

3. The method of claim 2 further comprising, after the fixing step, the step of separating the plurality of conductive patterns from each other.

4. The method of claim 1 wherein the forming step comprises energizing the at least one magnet to produce the magnetic field.

5. The method of claim 4 wherein the energizing step persists during the fixing step.

6. The method of claim 1 wherein the fixing step comprises applying a fixing liquid on the conductive pattern.

7. The method of claim 1 wherein the fixing step comprises attaching a protective sheet on the conductive pattern.

* * * * *